April 16, 1957 T. O. STANLEY 2,789,164

SEMI-CONDUCTOR SIGNAL AMPLIFIER CIRCUIT

Filed March 1, 1954 2 Sheets-Sheet 1

INVENTOR.
Thomas O. Stanley
BY H. L. Newton
ATTORNEY

April 16, 1957 — T. O. STANLEY — 2,789,164

SEMI-CONDUCTOR SIGNAL AMPLIFIER CIRCUIT

Filed March 1, 1954 — 2 Sheets-Sheet 2

INVENTOR.
Thomas O. Stanley

BY H. L. Newton

ATTORNEY

United States Patent Office 2,789,164

Patented Apr. 16, 1957

2,789,164

SEMI-CONDUCTOR SIGNAL AMPLIFIER CIRCUIT

Thomas O. Stanley, Princeton, N. J., assignor to Radio Corporation of America, a corporation of Delaware Application March 1, 1954, Serial No. 413,304

6 Claims. (Cl. 179—171)

Figure 1:
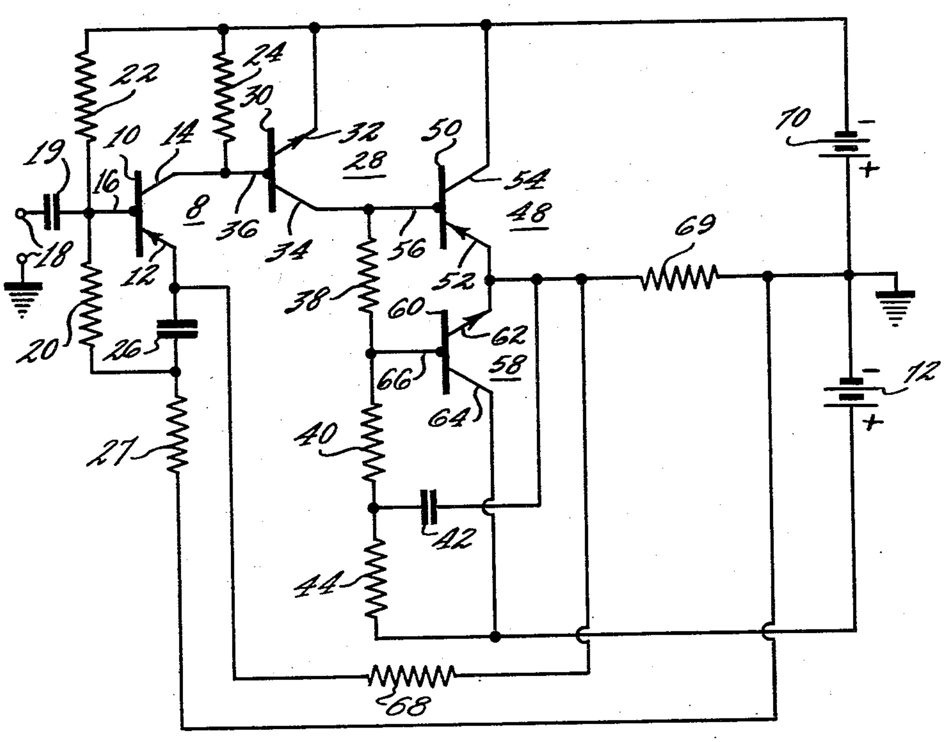

This invention relates in general to multi-stage signal amplifier circuits which include an output stage having two signal paths arranged for push-pull operation and in particular to signal amplifier circuits of that type which utilize semi-conductor devices such as transistors as active signal amplifying elements.

It is well known that a junction transistor of the N-P-N type has a symmetrical conduction characteristic when compared with a junction transistor of the P-N-P type. Thus N-P-N and P-N-P type transistors are referred to as being opposite conductivity or complementary symmetry types. Similarly, a point-contact transistor of the P-type is the symmetrical counterpart of a point-contact transistor of the N-type. The symmetrical properties of transistors are more fully described by George C. Sziklai in the "Proceedings of the I. R. E.," June 1953, pages 717–724.

The symmetrical properties of transistors, as referred to above, can be used for many different applications. For example, as described in Sziklai's article, as the base current is changed in the same direction in an N-P-N and a P-N-P transistor respectively, the flow of emitter-collector current will increase in one transistor and decrease in the other transistor. Accordingly, if properly connected, a pair of opposite conductivity transistors will provide a push-pull output. This is achieved, in general, by connecting the transistors in parallel. That is, the corresponding input electrodes of the transistors are connected for signal conduction or amplification to one of the terminals of an input circuit and corresponding output electrodes of the transistors are connected to one of the terminals of an output circuit. One electrode of each transistor may be common to the input and output circuits. If appropriate bias voltages are applied to the electrodes of the transistors, their symmetrical properties are such as to produce an opposite output effect from a given input condition. Accordingly, push-pull amplification is possible, and an amplified single-ended output signal may be derived directly from a single-ended input signal. Such an effect is not possible with conventional electron-tube circuits.

The circuit connections for complementary symmetry push-pull amplifiers may assume several different specific forms—depending on the application and particular operating characteristics desired. One known way of connecting such an amplifier is to couple the signal input circuit with the respective base electrodes which are, in turn, connected together. The emitter or output electrodes of the push-pull transistors are connected in common and a load device or utilization means is connected between the emitters and a source of fixed reference potential or ground for the system. The respective collectors are returned to either the positive or negative terminal of the power supply such as a pair of biasing batteries. Such a circuit configuration may be referred to as a common collector complementary symmetry push-pull amplifier.

Another application of the use of opposite conductivity transistors in combination, as referred to in Sziklai's article, is the direct coupling and cascading of two or more complementary units. Because of the static symmetry of opposite conductivity transistors, which permits direct coupling, the use of expensive coupling capacitors or other coupling means between stages may be eliminated. It is also known that direct current feedback may be employed to stabilize the operating point of such circuits, although such feedback is generally accomplished by signal degeneration as well.

Hence, a multi-stage signal amplifier may consist of a first transistor amplifier of one conductivity type which is direct coupled with a transistor amplifier of the opposite conductivity type. The latter transistor amplifier may serve as the driver for a common collector complementary symmetry push-pull amplifier. The first two stages may be biased to operate Class A, while the push-pull output stage may be biased to operate Class B. While such a circuit has been found useful, for example, as the audio-frequency signal amplifier of a superheterodyne signal receiver, it is subject to several disadvantages and limitations. Thus, for example, variations in the ambient temperature or the replacement of transistors may result in unstable operation and unbalanced current flow in the push-pull output transistors. This unbalance will result in excessive static current drain on the power supply, reducing the efficiency of the circuit. In addition, this unbalanced condition will cause a loss of dynamic range due to asymmetrical overload in the output circuit.

It is, accordingly, an object of the present invention to provide an improved multi-stage signal translating circuit employing semi-conductor devices as active signal amplifying elements wherein means are provided for stabilizing circuit operation with temperature variations.

It is another object of the present invention to provide an improved multi-stage signal translating circuit for the audio-frequency amplifying portions of radio receivers and the like which includes a push-pull amplifier circuit utilizing opposite conductivity transistors which is highly efficient in operation.

It is a further object of the present invention to provide an improved multi-stage audio frequency signal amplifying circuit which utilizes transistors wherein a balanced output current is achieved with a minimum number of circuit components.

It is yet another object of the present invention to provide an improved signal amplifying circuit for signal receivers and the like which utilizes cascade-connected transistors and wherein means are provided for stabilizing and adjusting circuit performance with temperature variations and for different circuit components.

It is a still further object of the present invention to provide an improved multi-stage signal amplifying circuit utilizing semi-conductor devices connected in cascade relation, wherein one of the stages includes a pair of transistors of opposite conductivity type connected for push-pull operation, and wherein feedback means are provided for stabilizing the operation of the circuit and providing efficient operation thereof without signal degeneration.

These and further objects and advantages of the present invention are achieved in general in a three stage signal amplifier circuit of the type referred to by the novel application of direct current feedback from the output to the first stage. By means of this expedient, balanced currents are maintained in the load and power supply. Hence, the static current drain on the power supply is minimized and efficient operation is realized. In addition, the gain of the amplifier circuit is maintained at a sufficiently high level and the dynamic range is not impaired, The circuitry is arranged and the feedback is applied in such a way that proper biasing of the first stage without excessive signal degeneration is achieved. Another feature of the present invention permits direct coupling from the first stage to the driver transistor while maintaining proper current flow in the first stage over a wide range of temperatures.

Figure 2:
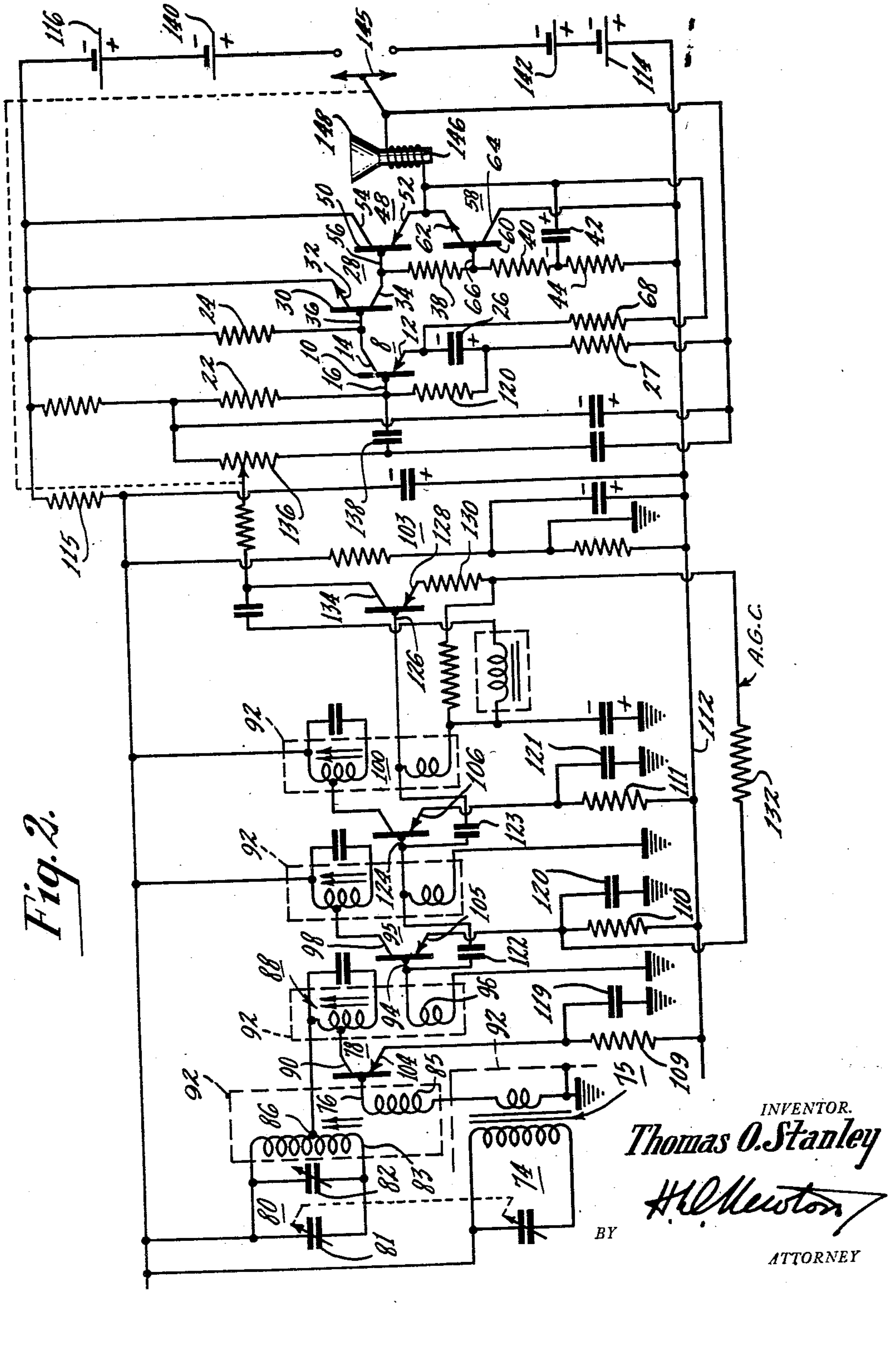

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of the audio frequency section of a radio signal receiver utilizing three stages including a complementary symmetry output stage connected in accordance with the present invention; and Figure 2 is a schematic circuit diagram of a transistorized radio signal receiver embodying the present invention.

Referring now to the drawing wherein like parts are indicated by like reference numerals in both figures and referring particularly to Figure 1, a three stage audio amplifier comprises a first transistor amplifier 8, a second transistor amplifier or driver 28, and a pair of push-pull transistors 48 and 58. Each of the transistors has been illustrated as being of the junction type and comprises a semi-conductive body having three contacting electrodes. Thus, the transistor 8 has a semi-conductive body 10 and three electrodes which have been designated as an emitter 12, a collector 14 and a base 16. Similarly, the transistor 28 has a semi-conductive body 30 and three electrodes which are an emitter 32, a collector 34 and a base 36. In the same manner, each of the push-pull output transistors 48 and 58 has a semi-conductive body 50 and 60 and three contacting electrodes which have been designated as emitters 52 and 62, collectors 54 and 64 and bases 56 and 66, respectively. As shown, the first transistor amplifier 8 is of the P-N-P type while the second transistor amplifier or driver 28 is of the N-P-N type. Transistor 48 of the push-pull stage is of the P-N-P type. Consequently, transistor 58 must be of the N-P-N type. It should be understood that the specific conductivity types are not critical so long as the biasing and conductivity between stages is correct. Furthermore, it should be noted that the invention is in no way limited to junction transistors. Other transistors such as N and P point-contact transistors or other devices which have operating characteristics which are complementary and symmetrical may be used.

To provide proper biasing for the first transistor amplifier 8, its base 16 is connected through a resistor 22 to the negative terminal of a direct current source of biasing voltage, such as illustrated by a battery 70. Further, the base 16 is connected through a pair of serially connected resistors 20 and 27 to the center tap of the biasing battery 70 and an oppositely poled biasing battery 72 or ground for the system. Hence, the resistors 22 and 20 comprise a bleeder network and maintain the voltage at the base 16 of the first transistor amplifier 8 at a slightly negative value with respect to the reference or center-tap voltage. The emitter 12 is returned through the resistors 68 and 69 to the reference or center-tap voltage. Thus the base 16 is negative with respect to the emitter 12. This is the proper polarity, as is well known, for amplifying action of a transistor of N-type conductivity, in this case a P-N-P junction transistor. The input circuit for the first transistor amplifier is completed by a pair of input terminals 18, one of which is grounded and the other of which is connected through a coupling capacitor 19 to the base 16.

The output or collector electrode 14 of the first transistor amplifier 8 is connected directly with the base 36 of the driving stage comprising the N-P-N transistor amplifier 28. The collector 14 of the first transistor 8 and the base 36 of the driver transistor 28, in accordance with one aspect of the present invention, are also connected through a resistor 24 to the negative terminal of the biasing battery 70. The resistor 24 permits direct coupling, in accordance with this feature of the invention, from the first transistor amplifier 8 to the driver transistor 28 while maintaining proper current flow in the first transistor 8 over a wide range of temperatures. Thus, the collector current of the first stage is shared by the base 36 of the driver transistor 28 and the resistor 24. Direct current feedback from the output circuit, which will be hereinafter described, functions to adjust the collector current of the first transistor 8 to a value which will serve to bias the driver transistor 28 to a predetermined value of collector current. The component of collector current from the first transistor 8 which flows into the base 36 of the driver transistor diminishes with increasing temperature and will ultimately reverse. The component of this current which flows through the resistor 24, however, remains relatively unchanged. This latter component constitutes essentially the total operating collector current of the first transistor 8 near the upper temperature limit. Hence, at increasing temperatures the base current of the driver 28 will decrease rapidly while the base-to-emitter voltage of the driver 28 will decrease just slightly for a constant driver collector current. Accordingly, by provision of the resistor 24 proper signal operation is insured even though the base current of the driver transistor 28 becomes small at elevated temperature.

Proper biasing for the driver transistor 28 is obtained by connecting its emitter 32 directly to the negative terminal of the biasing battery 70, and connecting its output or collector electrode 34 through three serially connected resistors, namely the resistors 38, 40 and 44 to the positive terminal of the other biasing battery 72. As thus provided, biasing of the driver transistor 28 is proper for amplifying action of an N-P-N transistor. Accordingly, the collector 34 will be positive with respect to the base 36 or biased in a relatively non-conducting or reverse direction, while the emitter 32 will be negative with respect to the base 36 or biased in a relatively conducting or forward direction.

Signal output currents, as discussed above, are taken from the collector 34 of the driver transistor 28, which is connected directly with the base 56 of one of the push-pull transistors 48. The principles of the present invention may find application to any transistor push-pull output stage, and in the present example are shown in connection with a push-pull amplifier of the type described and claimed in my copending application, Serial No. 413,056, filed on March 1, 1954, for "Efficient and Stabilized Semi-Conductor Amplifier Circuit." The base 56 of the push-pull output transistor 48 is connected through a resistor 38 having a low resistance such as 22 ohms as described in the aforementioned application to the base 66 of the other push-pull transistor amplifier 58. Thus, the output current from the driver transistor 28 flows through the resistor 38 and develops a small initial differential forward bias for the bases 56 and 66 of the respective push-pull transistors.

The output circuit for the push-pull stage includes the two emitters 52, 62 of the respective push-pull output transistors 48 and 58 which are connected together or in common as shown. The load resistor 69 for the circuit is connected from the junction of the respective emitters to a source of fixed reference potential or ground for the system which is the center-tap of the biasing batteries 70 and 72.

Further biasing voltages for the push-pull output transistors 48 and 58 are obtained by connecting the collector 54 of the transistor 48 directly with the negative terminal of the biasing battery 70 and the collector 64 of the transistor 58 directly with the positive terminal of the biasing battery 72. In addition, the base 66 of the N-P-N push-pull transistor 58 is connected through serially connected biasing resistors 40 and 44 to the positive terminal of the biasing battery 72. The resistors 40 and 44 may have resistances of, by way of example, 180 and 120 ohms, respectively. As thus described, biasing for the push-pull output transistors 48 and 58 is seen to be proper for amplification action. An alternating current feedback path is provided by connecting a capacitor 42 from the junction of the common emitters 52 and 62 and the load resistor 69 to the junction of the resistors 40 and 44, as described and claimed in my aforesaid copending application.

To insure balanced current flow in the output circuit, thus minimizing the static current drain on the power supply in accordance with another feature of the present invention, a direct-current feedback path is provided between the load circuit and the base-to-emitter circuit of the first transistor amplifier 8. Thus a resistor 68 which may have a resistance, by way of example, of 330 ohms is connected in accordance with the invention between the junction of the common emitters 52 and 62 of the push-pull stage and the load resistor 69 and the emitter 12 of the first transistor amplifier 8. As was explained hereinbefore, the bias for the first transistor amplifier 8 is established by the bleeder network comprising the resistors 20 and 22. Thus, any direct current voltage which is developed across the load resistor 69 by the flow of unbalanced currents in the push-pull output transistors will be subtracted from the bias applied to the first transistor amplifier 8 by virtue of the feedback path. Consequently, the conductive path including the resistor 68 is seen to provide direct current feedback. Hence, any departure from balanced output currents due to variations in the characteristics of different transistors or ambient temperature variations is of the proper polarity to be self-correcting. It has been found, for example, that the unbalance may be held within $\pm 10$ milliamperes from 0° to 50° centigrade. In addition, the driver transistor 28 may be replaced by one having, for example, three times the current gain and an unbalance of only 3 milliamperes will result. By maintaining current balance in the output circuit, excessive static current drain on either half of the battery supply is avoided, and asymmetrical overload is prevented. Thus the circuit is characterized by efficient operation. Furthermore, such a circuit has been found to be characterized by high gain.

In accordance with another feature of the invention, the emitter 12 of the first transistor amplifier 8 is connected through a capacitor 26 and a resistor 27 to the battery center tap or ground, as shown. Hence, any signal feedback from the load circuit is attenuated and the voltage gain of the entire amplifier will be established at approximately the ratio of the resistances of the resistor 20 to the resistor 27. Furthermore, the resistor 20 is connected from the base 16 of the first transistor amplifier 8 to the junction of the capacitor 26 and the resistor 27. The signal feedback from the load to the emitter 12 of the first transistor 8, attenuated by the network including the feedback resistor 68, the capacitor 26 and the resistor 27 increases the input impedance of the amplifier circuit. The degree of degeneration, when feedback of this type is utilized, is a function of the relative magnitudes of this input impedance to the impedance of the signal source. Since the resistor 20 is not in shunt with the input of the amplifier, but is, rather, in shunt with the base-to-emitter circuit of the first transistor 8, a resistor having a relatively low resistance may be used without introducing signal degeneration. Furthermore, by using a low resistance resistor 20, the performance of the circuit is further improved with respect to temperature variations and the interchangeability of different transistors. Accordingly, the network comprising the resistor 20, the capacitor 26 and the resistor 27 permits the application of direct current feedback to the circuit with all its attendant advantages without excessive degeneration of the signal. Consequently, a circuit in accordance with the invention is characterized by efficient, stable and high gain operation.

In operation, an input signal is applied through the capacitor 19 to the base 16 of the first transistor 8. An amplified signal is then coupled from the collector 14 of the first transistor amplifier 8 to the base 36 of the driver transistor 28. The amplified current in the collector 34 of the driver transistor 28 will be applied to the base electrodes 56 and 66 of the push-pull output transistors 48 and 58, respectively. As was pointed out above, the collector current from the driver transistor flowing through the resistor 38 which connects the bases of the output transistors is used to establish an initial differential bias for the output transistors. As was also previously explained, the output transistors 48 and 58 are connected to operate in Class B push-pull relation.

In view of the fact that the transistor 48 is a P-N-P junction while the transistor 58 is an N-P-N junction, or in other words that the transistors 48 and 58 are of opposite conductivity types, the signal which is applied to the transistors from the driver transistor 28 will have an opposite symmetrical effect on the emitter current of each of them. Hence, a negative signal will cause the P-N-P transistor 48 to conduct. At the same time, the N-P-N transistor 58 will be non-conductive. A differential current will, therefore, flow through the output load impedance 69. For positive signals the conduction of the respective transistors will be just the opposite. Hence, the effect on the output circuit of the circuit illustrated in Figure 1 is seen to be that of push-pull amplification.

A circuit of the type illustrated in Figure 1 may be used as the output stage of a superheterodyne signal receiver, for example. Figure 2 of the drawing illustrates such an application wherein an antenna such as a ferrite-cored loop, indicated generally by the tuned circuit 74 is transformer coupled by means of the coupling transformer 75 to the base 76 of a converter transistor 78 which serves as an oscillator and mixer for the receiver. The tuned or tank circuit for the oscillator is indicated by the numeral 80 and comprises a pair of parallel tuning capacitors 81 and 82 and a parallel inductor 83. The tuning capacitor may be gang connected as shown to the variable turning capacitor of the antenna circuit 74 for uni-control tuning purposes. Feedback for sustain oscillation is provided by an inductor 85 or tickler coil which is inductively coupled with the inductor 83. Since the inductor 83 of the tuned circuit 80 is connected by means of a tap 86 to the high voltage end of the tuned output circuit 88 of the converter, feedback between the collector 90 and the base 76 of the converter transistor 78 is provided in phase and magnitude to sustain oscillations. Shielding for the several coupling networks is provided by several shield cans each of which has been indicated by the numeral 92.

By providing the converter transistor 78 with the connections therefor as shown, the incoming signal will be coupled through the transformer 75 to the base 76 of the converter transistor 78 where it will be mixed with the oscillator signal. The resulting beat or intermediate frequency signal appearing in the output circuit 88 of the converter transistor 78 will be coupled to the base 94 of a first transistor amplifier 95 by virtue of the coupling existing between the inductor of the output circuit 88 and the inductor 96 in the base circuit of the transistor amplifier 95. The amplified signal appearing on the collector 98 of the first transistor amplifier 95 will subsequently be coupled to a second transistor amplifier 100 where it will again be amplified and coupled to the base 126 of a third transistor amplifier 103 which serves as the detector for the receiver.

It should be noted that each of the input circuits for the transistor converter 78 and the first, second and third transistor amplifiers 95, 100 and 103, respectively, is returned to a source of fixed reference potential or ground for the system. Furthermore, the transistor converter 78 and the first and second transistor amplifiers 95 and 100 are constant emitter current biased by returning their emitters 104, 105 and 106, respectively, to a positive bus 112 which is connected with the positive terminal of a biasing battery 114. Each of the resistors 109, 110 and 111 is by-passed to ground by respective by-pass capacitors 119, 120 and 121. Hence, radio frequency signal isolation of the input circuits from the positive side of the battery is provided. The positive side of the battery 114 is set at approximately 1 volt. Collector biasing voltages for each of these stages is provided by connecting the respective collectors through the tuned output circuits and the resistor 115 to the negative terminal of a further biasing battery 116. While the transistors serving as the converter, first and second amplifiers and the detector have all been illustrated as being of the P-N-P junction type—any other suitable type would be utilized as long as the proper changes in biasing voltages were made when needed.

Neutralization is provided by connecting small neutralizing capacitors 122 and 123 from the base 94 of the first transistor amplifier 95 to the base 124 of the second transistor amplifier 100 and from the base 124 of the second transistor amplifier to the base 126 of the third transistor amplifier 103, respectively. Automatic gain control for the receiver is provided by connecting the emitter 128 of the detector 103 through a first and a second resistor 130, 132, respectively, to the emitter 105 of the first transistor amplifier 95. In this manner, as the signal increases in strength the emitter current of the detector 103 will also proportionately increase. Variations of the emitter current of the detector are applied by way of resistors 130 and 132 to the emitter 105 of the first transistor amplifier 95. This will vary the emitter current of the first transistor amplifier 95 in such a way that its gain is reduced with increasing signal strength.

The audio frequency signal appearing on the collector 134 of the transistor detector 103 will develop an audio frequency voltage across the variable resistor 136 which serves as a volume control for the receiver. The audio frequency signal thus developed is coupled through a coupling capacitor 138 to the base 16 of the first audio frequency amplifier 8. From this point, the circuitry is seen to be substantially identical with the circuit illustrated in Figure 1 and embodies the same desirable features of the present invention as explained in connection with Figure 1. Hence, a push-pull output stage comprising two opposite conductivity transistors 48 and 58 is provided which is driven by the transistor driver 28 of the N-P-N junction type, the base 36 of which is connected with the collector 14 of the first audio frequency signal transistor amplifier 8.

The source of biasing voltages for the receiver illustrated in Figure 2 is four separate battery cells 114, 116, 140 and 142 rather than the two batteries shown in Figure 1. The batteries are arranged such that the batteries 116 and 140 are connected in series on one side of an on-off switch 145 and the batteries 142 and 114 are connected in series on the other side of the on-off switch 145. The on-off switch 145 may be gang-connected as shown for convenience of operation to the variable tap of the volume control resistor 136. Output signals are developed across the voice coil 146 of a loudspeaker 148. To this end, the voice coil 146 is connected between the junction of the common emitters 52 and 62 and the switch 145. Hence, the push-pull output signal appearing on the voice coil 146 will be reproduced as an audible audio signal by the loudspeaker 148.

The receiver illustrated in Figure 2 is seen to operate in accordance with well known superheterodyne principles. Furthermore, by provision of the novel features of the present invention, it incorporates an improved and efficient three stage audio signal amplifier circuit which utilizes a push-pull Class B output circuit of the complementary symmetry type. Such a circuit, as described herein, maintains balanced currents in the load and power supply. Furthermore, the gain of the circuit is maintained at a sufficiently high level and the dynamic range is not impaired. While the use of such a circuit has been illustrated in connection with a superheterodyne signal receiver, this use should not be considered exclusive, and others where a reliable and efficient power output stage is required should be apparent.

What is claimed is:

1. In a multi-stage signal amplifying circuit including a push-pull amplifying stage comprising a first and a second semi-conductor device of opposite conductivity type each having input electrodes and common output electrodes, the combination comprising, a third semi-conductor device of one conductivity type having an input, an output and a further electrode, a driver stage including a fourth semi-conductor device of an opposite conductivity type to said third device and including input and output electrodes, conductive means connecting the output electrode of said third device with the input electrode of said fourth device, a resistor connected from a point on said conductive means to a source of direct-current biasing potential to provide stable biasing of said fourth device, further conductive means coupling the output electrode of said fourth device with the input electrodes of said first and second devices, a single ended signal output circuit including utilization means connected with the output electrodes of said first and second devices for developing thereacross a push-pull output signal, and direct-current feedback means coupling said signal output circuit with the further electrode of said third semi-conductor device, said feedback means being operative to provide balanced current flow in said output circuit.

2. A multi-stage signal translating circuit comprising, in combination, an amplifying stage including a first transistor having base, emitter and collector electrodes, a driving stage including a second transistor of an opposite conductivity type to said first transistor and having emitter, base and collector electrodes, conductive circuit means directly connecting the collector electrode of said first transistor with the base electrode of said second transistor, a push-pull signal amplifying stage including a third and fourth transistor of opposite conductivity types and each having base, emitter and collector electrodes, means providing a single ended output circuit for said third and fourth transistor connected with the emitter electrodes of said third and fourth transistors, means coupling the collector electrode of said second transistor with the base electrodes of said third and fourth transistors, and direct-current feedback means connecting said output circuit with the emitter electrode of said first transistor, said feedback means being operative to provide balanced current flow in said output circuit.

3. In a multi-stage signal amplifying circuit including a push-pull amplifying stage comprising a first and a second semi-conductor device of opposite conductivity type each having base and collector electrodes and common emitter electrodes, the combination comprising, a third semi-conductor device of one conductivity type having a base, a collector and an emitter electrode, signal attenuation means coupling the emitter electrode of said third device with a point of fixed reference potential, a driver stage including a fourth semi-conductor device of an opposite conductivity type to said third device and including base, collector and emitter electrodes, conductive means connecting the collector electrode of said third device with the base electrode of said fourth device, a resistor connected from a point on said conductive means to a direct-current source of biasing potential to provide stable biasing of said fourth device, further conductive means coupling the collector electrode of said fourth device with the base electrodes of said first and second devices, a signal output circuit providing an output signal and including utilization means connected in common with and between the emitter electrodes of said first and second devices and a point of fixed reference potential, and direct-current feedback means coupling said signal output circuit with the junction of the emitter electrode of said third semi-conductor device and said signal attenuation means, said feedback means being operative to provide balanced current flow in said output circuit.

4. A multi-stage signal translating circuit adapted for operation as the audio frequency amplifier of signal receivers and the like comprising, in combination, an amplifying stage including a first semi-conductor device having base, emitter and collector electrodes, signal attenuation means including a serially connected capacitor and a first resistor connected between said emitter electrode and a source of fixed reference potential, a second resistor connected between said base electrode and the junction of said capacitor and first resistor, a driving stage including a second semi-conductor device having input and output electrodes, conductive circuit means coupling the collector electrode of said first device with the input electrode of said second device, a push-pull signal amplifying stage including a third and fourth semi-conductor device, an output circuit for said third and fourth devices, means coupling the output electrode of said second device with the input electrodes of said third and fourth devices, and direct-current feedback means connecting said output circuit to the junction of said emitter electrode and said capacitor, said feedback means being operative to provide balanced current flow in said output circuit.

5. In a multi-stage signal amplifying circuit including a push-pull amplifying stage comprising a first and a second semi-conductor device each having input, output and common electrodes, the combination comprising, a third semi-conductor device having an input, an output and a common electrode, signal attenuation means coupling the common electrode of said third device with a point of ground potential, a driver stage including a fourth semi-conductor device and including an input, an output and a common electrode, conductive means connecting the output electrode of said third device with the input electrode of said fourth device, further conductive means connecting the output electrode of said third device with the input electrodes of said first and second devices, an output circuit connected in common with and between the output electrodes of said first and second devices and said point of ground potential, and direct-current feedback means connecting said output circuit with the junction of the common electrode of said third device and said signal attenuation means.

6. A multi-stage signal translating circuit comprising, in combination, an amplifying stage including a first semi-conductor device having base, emitter and collector electrodes, signal attenuation means coupled with said emitter electrode, a driving stage including a second semi-conductor device having input and output electrodes, conductive circuit means connecting the collector electrode of said first device with the input electrode of said second device, a push-pull signal amplifying stage including a third and a fourth semi-conductor device, single ended output circuit means connected with said third and fourth devices for developing thereacross a push-pull output signal, menas connecting the output electrode of said second device with said third and fourth device, and direct-current feedback means coupling said output circuit means with the junction of said emitter electrode and said signal attenuation means.

References Cited in the file of this patent

UNITED STATES PATENTS 2,554,279 Tharp ---------------- May 22, 1951

OTHER REFERENCES

Sziklai article, "Electronic Engineering," September 1953, pages 358, 364.

Shea text, "Principles of Transistor Circuits," pages 341, 342, 349–351, pub. 1935 by John Wiley & Sons, Inc., New York city, N. Y.

Terman text, "Radio Engineering," 3rd edition, pages 323–326, pub. 1947 by McGraw-Hill Book Co., New York city.